United States Patent
Kikuchi et al.

(10) Patent No.: US 10,988,400 B2
(45) Date of Patent: Apr. 27, 2021

(54) TRANSPARENT SEALING MEMBER

(71) Applicant: NGK Insulators, Ltd., Nagoya (JP)

(72) Inventors: Yoshio Kikuchi, Nagoya (JP); Hiroyuki Shibata, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/801,740

(22) Filed: Feb. 26, 2020

(65) Prior Publication Data

US 2020/0189961 A1 Jun. 18, 2020

Related U.S. Application Data

(63) Continuation of application No. PCT/JP2017/031212, filed on Aug. 30, 2017.

(51) Int. Cl.
| | |
|---|---|
| *C03C 3/06* | (2006.01) |
| *C03C 17/02* | (2006.01) |
| *H01L 33/56* | (2010.01) |
| *H01L 33/58* | (2010.01) |
| *C03C 4/00* | (2006.01) |

(52) U.S. Cl.
CPC ............... *C03C 3/06* (2013.01); *C03C 17/02* (2013.01); *H01L 33/56* (2013.01); *H01L 33/58* (2013.01); *C03C 4/0071* (2013.01); *C03C 4/0085* (2013.01); *C03C 2201/32* (2013.01)

(58) Field of Classification Search
CPC .......... H01L 33/56; H01L 33/58; C03C 3/06; C03C 4/0085; C03C 17/02; C03C 2201/32
See application file for complete search history.

(56) References Cited

U.S. PATENT DOCUMENTS

| | | | | |
|---|---|---|---|---|
| 3,765,994 A | * | 10/1973 | Quaintance | G03C 1/77 430/5 |
| 3,927,697 A | * | 12/1975 | Baumler | C03B 23/20 138/145 |
| 2008/0166506 A1 | * | 7/2008 | Shin | H04M 1/22 428/29 |
| 2009/0127576 A1 | | 5/2009 | Jang et al. | |
| 2010/0237254 A1 | | 9/2010 | Mason et al. | |

(Continued)

FOREIGN PATENT DOCUMENTS

| | | |
|---|---|---|
| JP | 2009-532200 A1 | 9/2009 |
| JP | 5243806 B2 | 7/2013 |

(Continued)

OTHER PUBLICATIONS

English Translation of International Preliminary Report on Patentability (Chapter I) (Application No. PCT/JP2017/031212) dated Mar. 12, 2020.

(Continued)

*Primary Examiner* — Daniel Petkovsek
(74) *Attorney, Agent, or Firm* — Burr & Brown, PLLC

(57) ABSTRACT

The present invention relates to a transparent sealing member. A quartz glass transparent sealing member is used in an optical component having at least one optical element, and a mounting board on which the optical element is mounted, and constitutes, with the mounting board, a package that houses the optical element. The concentration of aluminum in a surface portion is higher than the concentration of aluminum in an inner portion.

4 Claims, 4 Drawing Sheets

(56) References Cited

U.S. PATENT DOCUMENTS

2015/0353417 A1    12/2015  Mori et al.
2017/0114253 A1*   4/2017   Nakayama ............ C08F 216/14
2017/0155020 A1    6/2017   Lin et al.

FOREIGN PATENT DOCUMENTS

| JP | 2015-143324 A1 | 8/2015 | |
| JP | 6068411 B2 | 1/2017 | |
| JP | 2017-108129 A1 | 6/2017 | |
| WO | WO-2009156856 A2 * | 12/2009 | ........... H01L 33/505 |

OTHER PUBLICATIONS

International Search Report and Written Opinion (Application No. PCT/JP2017/031212) dated Nov. 14, 2017.

* cited by examiner

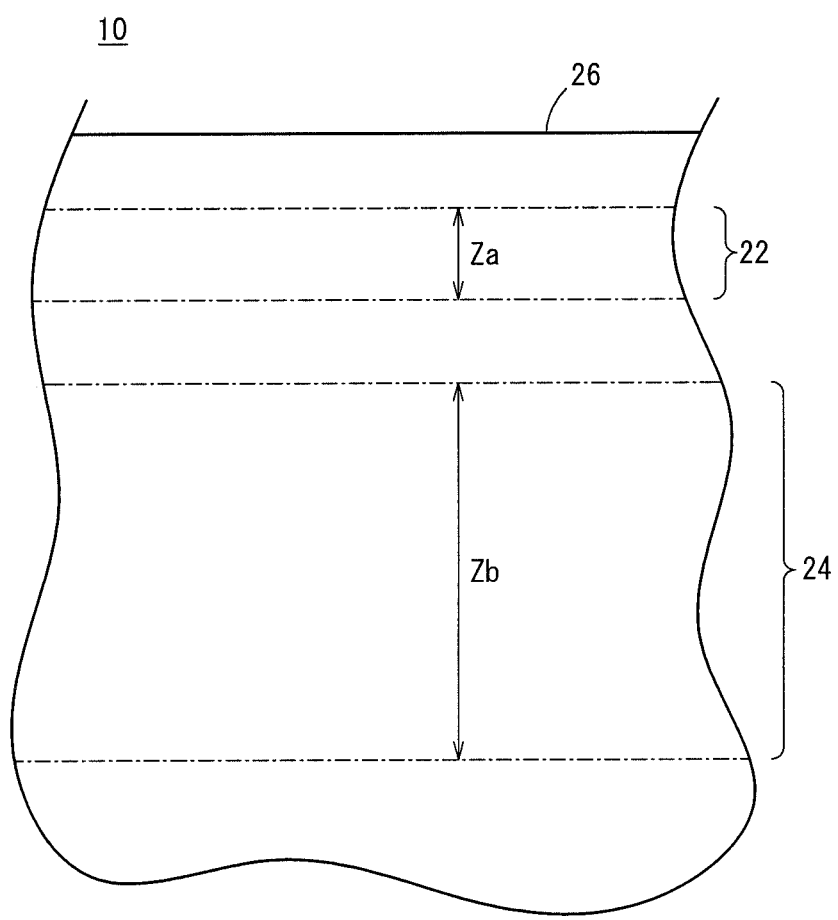

FIG. 4

[Table 1]

|  | Manufacturing Method | Al Concentration | | Total Light Transmittance | |
| --- | --- | --- | --- | --- | --- |
|  |  | Surface Portion ppm | Interior Portion ppm | Initial % | After Immersion % |
| Exemplary Embodiment 1 | Powder Sintering | 1515 | 30 | 91 | 76 |
| Exemplary Embodiment 2 | Powder Sintering | 1061 | 61 | 91 | 74 |
| Exemplary Embodiment 3 | Powder Sintering | 758 | 45 | 91 | 72 |
| Comparative Example 1 | Polished Product | 30 | | 91 | 55 |
| Comparative Example 2 | Polished Product | 0.04 | | 92 | 22 |
| Comparative Example 3 | Polished Product | 1211 | | 89 | 73 |

TRANSPARENT SEALING MEMBER

CROSS-REFERENCE TO RELATED APPLICATION

This application is a Continuation of International Application No. PCT/JP2017/031212 filed on Aug. 30, 2017, the contents all of which are incorporated herein by reference.

TECHNICAL FIELD

The present invention relates to a transparent sealing member which is used in an optical component, for example, such as an LED (light emitting diode), an LD (semiconductor laser), or the like.

BACKGROUND ART

Recently, methods of using a light emitting element (ultraviolet LED) that emits ultraviolet radiation for the purposes of sterilization and purification are becoming widespread. In such an ultraviolet LED device, a transparent sealing member is required in order to protect the light emitting element from the outside air and moisture. From the standpoints of permeability to ultraviolet radiation and durability, glass or quartz glass is used as the transparent sealing member.

In Japanese Patent No. 6068411 and Japanese Laid-Open Patent Publication No. 2009-532200 (PCT), a water purification device using an ultraviolet LED is disclosed. In Japanese Patent No. 5243806, a transparent sealing member is disclosed in which a translucent plate material and a hemispherical lens are formed together in an integrated manner.

SUMMARY OF INVENTION

In general, in applications for purifying liquids such as polluted water and the like, there are cases in which, for example, protein based or organic based contaminants may adhere to the surface of the transparent sealing member. In such cases, a problem is known in which, for example, the amount of ultraviolet light emitted from the optical element decreases at the surface of the transparent sealing member, and the sterilizing effect due to the ultraviolet light decreases.

The present invention has been devised taking into consideration such a problem, and has the object of providing a transparent sealing member in which the following effects are exhibited.

(a) It is possible to suppress a decrease in transmittance due to oxygen defects.

(b) It is possible to make it unlikely for protein based or organic based contaminants to adhere thereto, and to suppress a reduction in a sterilizing effect due to such contaminants.

[1] A transparent sealing member according to the present invention is characterized by a transparent sealing member made of quartz glass, the transparent sealing member being used in an optical component having at least one optical element and a mounting substrate on which the the mounting substrate, a package in which the optical element is accommodated, wherein an aluminum concentration of a surface portion of the transparent sealing member is higher than an aluminum concentration of an interior portion thereof.

By the aluminum concentration of the surface portion being higher than the aluminum concentration of the interior portion, it is possible to suppress a decrease in transmittance due to oxygen defects, together with suppressing the adherence of organic substances and fine particles to the surface of the transparent sealing member.

[2] In the present invention, assuming that the aluminum concentration of the surface portion is represented by A (ppm), and the aluminum concentration of the interior portion is represented by B (ppm), then the inequality $10 \leq A/B \leq 200$ is preferably satisfied.

[3] In the present invention, assuming that the aluminum concentration of the surface portion is represented by A (ppm), and the aluminum concentration of the interior portion is represented by B (ppm), then the inequality $15 \leq A/B \leq 60$ is preferably satisfied.

[4] In the present invention, the aluminum concentration of the surface portion is preferably from 500 to 2000 ppm, and the aluminum concentration of the interior portion is preferably from 10 to 100 ppm.

[5] In the present invention, the surface portion is preferably a region having a depth of 0.05 to 0.20 μm from a surface, and the interior portion is preferably a region having a depth of 1 to 5 μm from the surface. As has been described above, the transparent sealing member according to the present invention exhibits the following effects.

(a) It is possible to suppress a decrease in transmittance due to oxygen defects.

(b) It is possible to make it unlikely for protein based or organic based contaminants to adhere thereto, and to suppress a reduction in a sterilizing effect due to such contaminants.

BRIEF DESCRIPTION OF DRAWINGS

FIG. 2 is an explanatory diagram showing a surface portion and an interior portion of the transparent sealing member;

FIG. 4 is a Table 1 showing manufacturing methods, Al concentrations (of a surface portion and an interior portion), an initial total light transmittance, and a total light transmittance after immersion, in Exemplary Embodiments 1, 2, and 3 and Comparative Examples 1, 2, and 3.

DESCRIPTION OF EMBODIMENTS

Embodiments of a transparent sealing member according to the present invention will be presented and described below with reference to FIGS. 1A to 4.

Figure 1A:
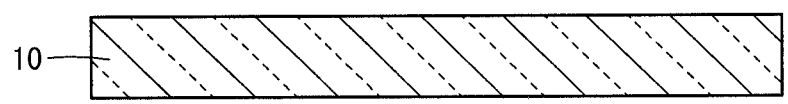
FIG. 1A is a vertical cross-sectional view showing a transparent sealing member according to a present embodiment.

As shown in FIG. 1A, the transparent sealing member 10 according to the present embodiment is formed, for example, in a flat plate-like shape. An outer shape of the transparent sealing member 10, for example, is of a cylindrical shape, a quadrangular shape, a polygonal tubular shape, or the like. The transparent sealing member 10 is constituted, for example, from quartz glass.

Figure 1B:
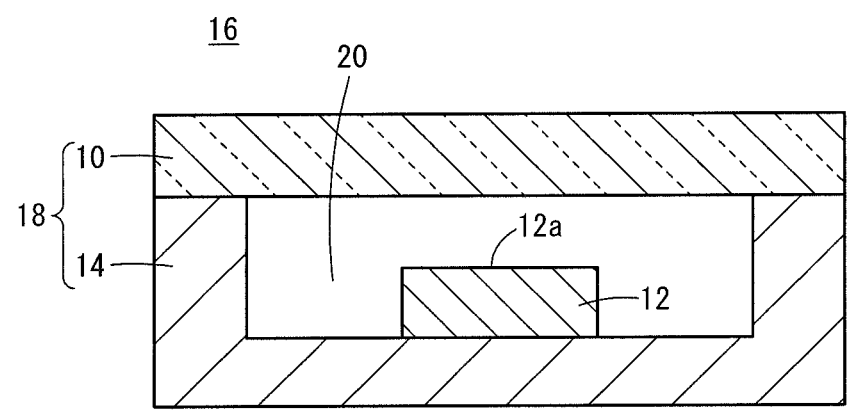
FIG. 1B is a vertical cross-sectional view showing an example of an optical component constituted by a transparent sealing member being sealed thereon.

As shown in FIG. 1B, the transparent sealing member 10 is used in an optical component 16 having at least one optical element 12 that emits, for example, ultraviolet light, and a mounting substrate 14 on which the optical element 12 is mounted, and constitutes a package 18 in which the optical element 12 is accommodated together with the mounting substrate 14.

The mounting substrate 14 includes a concave portion 20 having an upper surface opening, and the optical element 12 is mounted on a bottom part of the concave portion 20. The transparent sealing member 10 is sealed on the mounting substrate 14, in a manner so as to close the upper surface opening of the concave portion 20 of the mounting substrate 14. The mounting substrate 14 is constituted, for example, from AlN (aluminum nitride).

Although not illustrated, the optical element 12 is configured, for example, by laminating a GaN based crystalline layer having a quantum well structure on a sapphire substrate. As a method of mounting the optical element 12, for example, a so-called face up mounting method can be adopted in which the optical element is mounted with a light emitting surface 12a thereof being faced toward the transparent sealing member 10. More specifically, terminals (not shown) that are led out from the optical element 12, and circuit wirings (not shown) that are formed on the mounting substrate 14, for example, are electrically connected by bonding wires (not shown). Of course, a so-called flip chip mounting, in which the optical element is mounted with the light emitting surface 12a being faced toward the mounting substrate 14, can also be favorably employed.

As a method of manufacturing the transparent sealing member 10, preferably, a powder sintering method can be employed. For example, a molding slurry containing silica powder and an organic compound is cast into a molding die and solidified by a chemical reaction mutually with the organic compound, for example, a chemical reaction between a dispersion medium and a curing agent, or mutually with the curing agent, and thereafter, the solidified product is released from the mold. Then, the transparent sealing member 10 can be produced by firing.

Concerning the dimensions of the transparent sealing member 10, a height thereof is 0.1 to 10 mm, and an outer diameter thereof is 3.0 to 10 mm. Moreover, concerning the dimensions of the optical element 12, a thickness thereof is 0.005 to 0.5 mm, and although not shown, a vertical dimension as viewed from the upper surface is 0.5 to 2.0 mm, and a horizontal dimension is 0.5 to 2.0 mm.

In addition, in the transparent sealing member 10, as shown in FIG. 2, the concentration of aluminum (hereinafter, referred to as an Al concentration) of the surface portion 22 is higher than the Al concentration of the interior portion 24. In this instance, the surface portion 22 of the transparent sealing member 10 indicates a region Za having a depth of 0.05 to 0.20 μm from a surface 26, and the interior portion 24 indicates a region Zb having a depth of 1 to 5 μm from the surface 26.

The Al concentration of the surface portion 22 is preferably 500 to 2000 ppm, and the Al concentration of the interior portion 24 is 10 to 100 ppm. Further, assuming that the Al concentration of the surface portion 22 is represented by A (ppm), and the Al concentration of the interior portion 24 is represented by B (ppm), then the inequality $10 \le A/B \le 200$ is preferably satisfied, and more preferably, the inequality $15 \le A/B \le 60$ is satisfied.

In this manner, because the Al concentration of the surface portion 22 is higher than the Al concentration of the interior portion 24, the transparent sealing member 10 exhibits the following effects.

More specifically, in the case that the Al concentration of the interior portion 24 of the transparent sealing member 10 is high, it leads to an increase in oxygen defects. Since such oxygen defects absorb ultraviolet radiation, the interior portion 24 of the transparent sealing member 10 preferably has a low Al concentration in order to suppress a decrease in transmittance due to the oxygen defects.

In general, in applications for purifying liquids such as polluted water and the like, there are cases in which, for example, protein based or organic based contaminants may adhere to the surface 26 of the transparent sealing member 10. In such cases, a problem is known in which, for example, the amount of ultraviolet light emitted from the optical element 12 decreases at the surface 26 of the transparent sealing member 10, and the sterilizing effect due to the ultraviolet light decreases. In particular, in the case that the transparent sealing member 10 has a complicated shape such as a lens shape or the like, since there is a portion therein where the liquid tends to remain or stagnate, the aforementioned problem becomes prominent.

In the case that the Al concentration of the surface portion 22 of the transparent sealing member 10 is high, a portion of the Si that makes up the silica ($SiO_2$) is replaced by Al. When $Si(+4)$ is replaced by $Al(+3)$, the surrounding vicinity of Al acquires a $-1$ valence value.

Stated otherwise, the Al substituted sites become negatively charged. In particular, the surface 26 of the transparent sealing member 10 becomes negatively charged. Since the aforementioned organic substances and fine particles are generally negatively charged in water, it becomes unlikely for such organic substances and fine particles to adhere to the surface 26 of the negatively charged transparent sealing member 10.

Figure 3:
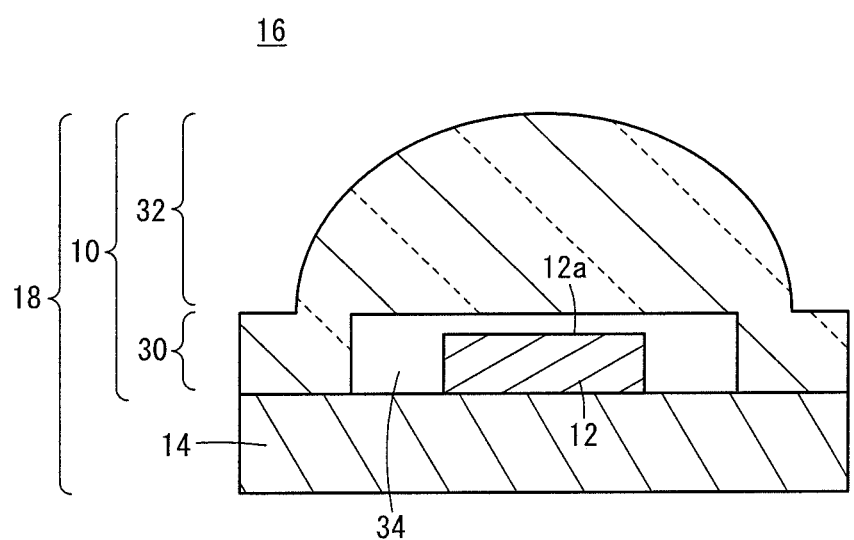
FIG. 3 is a vertical cross-sectional view showing an example of an optical component configured by a transparent sealing member having a lens shape being sealed thereon.

Accordingly, as shown, for example, in FIG. 3, even if the transparent sealing member 10 has a complicated shape such as a lens shape or the like, and there is a portion where the liquid tends to remain or stagnate, it is possible to suppress the adhesion of organic substances and fine particles to the surface 26 of the transparent sealing member 10. Moreover, as shown in FIG. 3, the transparent sealing member 10 includes an annular pedestal 30, which is arranged so as to surround the optical element 12 that is mounted on the mounting substrate 14 from the periphery thereof, and a lens body 32 that is integrally formed on the pedestal 30. In the pedestal 30 of the transparent sealing member 10, a concave portion 34 (accommodating space) is formed having an opening on the lower surface thereof. At least the optical element 12 is accommodated in the concave portion 34.

In the foregoing manner, by the Al concentration of the surface portion 22 being higher than the Al concentration of the interior portion 24, it is possible to suppress a decrease in transmittance due to oxygen defects, together with suppressing the adherence of organic substances and fine particles to the surface 26 of the transparent sealing member 10.

EXEMPLARY EMBODIMENTS

Next, in relation to Examples 1 to 3 and Comparative Examples 1 to 3, an influence due to the Al concentration on the surface portion 22 and the interior portion 24 of the transparent sealing member 10 was confirmed.

Exemplary Embodiment 1

The transparent sealing member 10 according to Exemplary Embodiment 1 has a configuration similar to that of the transparent sealing member 10 shown in FIG. 1A.
(Manufacturing of the Transparent Sealing Member)

The method of manufacturing the transparent sealing member 10 according to Exemplary Embodiment 1 is as described below. More specifically, a slurry was prepared by mixing 100 parts by mass of a silica powder having an average particle diameter of 0.5 μm as a raw material powder, 2 parts by mass of a carboxylic acid copolymer as a dispersing agent, 49 parts by mass of dimethyl malonate as a dispersing medium, 4 parts by mass of ethylene glycol, 4 parts by mass of 4'4-diphenylmethane diisocyanate as a curing agent, and 0.4 parts by mass of triethylamine as a catalyst. The Al concentration of the silica powder was 70 ppm.

The slurry was poured into a metal mold at room temperature, and left at room temperature for a fixed time period. Subsequently, the molded body was released from the mold. Furthermore, the molded body was allowed to stand at room temperature, and then at a temperature of 90° C. for a certain period of time in order to obtain a silica powder dried body. Moreover, the average particle diameter of the raw material powder was measured using a laser diffraction/scattering particle size distribution measurement apparatus LA-750 manufactured by Horiba.

The thus manufactured silica powder dried body was calcined at 500° C. in air, and then fired at 1600 to 1700° C. while a hydrogen gas was introduced at 5 to 10 L/min, to thereby become denser and be made transparent in order to produce the transparent sealing member 10. The transparent sealing member 10 has an outer shape of 3.5 mm square and a height of 0.5 mm.

Exemplary Embodiment 2

A transparent sealing member 10 according to Exemplary Embodiment 2 was manufactured in a similar manner to Exemplary Embodiment 1, except that the amount of hydrogen gas was reduced by 70% from that in Exemplary Embodiment 1.

Exemplary Embodiment 3

A transparent sealing member 10 according to Exemplary Embodiment 3 was manufactured in a similar manner to Exemplary Embodiment 1, except that the Al concentration of the silica powder was 50 ppm, and the amount of hydrogen gas was reduced by 50% from that in Exemplary Embodiment 1.

Comparative Example 1

A transparent sealing member 10 according to Comparative Example 1 was manufactured by removing the surface portion 22 by a polishing process, after having manufactured the transparent sealing member 10 in the same manner as in Exemplary Embodiment 1.

Comparative Example 2

A transparent sealing member 10 according to Comparative Example 2 was manufactured by polishing a fused silica glass.

Comparative Example 3

A transparent sealing member 10 according to Comparative Example 3 was manufactured by adding aluminum ethylate so that the Al concentration of the silica powder became 1300 ppm, then manufacturing the transparent sealing member 10 in the same manner as in Exemplary Embodiment 3, and thereafter, removing a region having a depth of 1 μm from the surface by a polishing process.

<Evaluation Method>
(Al Concentrations of Surface Portion and Interior Portion)

In relation to Exemplary Embodiments 1 to 3 and Comparative Examples 1 to 3, the Al concentrations of the surface portion 22 and the interior portion 24 were measured. Measurement of the Al concentrations was carried out by SIMS (secondary ion mass spectrometry) from the surface 26 of the transparent sealing member 10.

(Total Light Transmittance and Immersion Test)

Concerning Exemplary Embodiments 1 to 3 and Comparative Examples 1 to 3, a total light transmittance prior to implementing an immersion test thereon was defined as an initial total light transmittance. The samples were irradiated with ultraviolet light having a wavelength of 280 nm, and the initial total light transmittances of Exemplary Embodiments 1 to 3 and Comparative Examples 1 to 3 were measured. The total light transmittances were measured using a spectrophotometer manufactured by JASCO Corporation.

Thereafter, Exemplary Embodiments 1 to 3 and Comparative Examples 1 to 3 were immersed and held in a system through which raw water obtained from a water purification plant is circulated. After one month, the samples were taken out from the system, and the total light transmittances of Exemplary Embodiments 1 to 3 and Comparative Examples 1 to 3 were measured in the same manner as described previously. Such measured amounts were defined as a total light transmittance after immersion.

(Evaluation Results)

Table 1 of FIG. 4 shows the Al concentration, the initial total light transmittance, and the total light transmittance after immersion of the surface portion 22 and the interior portion 24 in Exemplary Embodiments 1 to 3 and Comparative Examples 1 to 3

(Discussion)

First, the Exemplary Embodiments 1 to 3 all exhibited a high initial total light transmittance of 91%. From the fact that the Al concentration of the interior portion 24 was low, it may be considered that a decrease in transmittance due to oxygen defects was suppressed.

Further, in Exemplary Embodiments 1 to 3, the total light transmittance after immersion was a high value of greater than or equal to 72%. From the fact that the Al concentration in the surface portion 22 was high, it may be considered that the adherence of organic substances and fine particles to the surface 26 of the transparent sealing member 10 was suppressed.

On the other hand, in Comparative Examples 1 and 2, although the initial total light transmittance was high, the total light transmittance after immersion was low. Such a characteristic may be considered to have occurred since, from the fact that the Al concentration of the surface portion 22 was low, the total light transmittance after immersion was reduced due to the adherence of organic substances and fine particles to the surface 26 of the transparent sealing member 10.

In Comparative Example 3, although the total light transmittance after immersion was high, the initial total light transmittance was low. Such a characteristic may be considered to have occurred since, from the fact that the Al concentration of the interior portion 24 was high, a decrease in transmittance was caused due to oxygen defects in the transparent sealing member 10.

The transparent sealing member according to the present invention is not limited to the above-described embodiments, and it is a matter of course that various configurations can be adopted therein without departing from the essence and gist of the present invention.

The invention claimed is:

1. A transparent sealing member made of quartz glass, the transparent sealing member being used in an optical component having at least one optical element and a mounting substrate on which the optical element is mounted, and constituting, together with the mounting substrate, a package in which the optical element is accommodated;

wherein a surface portion of the transparent sealing member indicates a region that is formed at a depth of 0.05 to 0.20 μm from a surface of the transparent sealing member facing away from the mounting substrate and an interior portion of the transparent sealing member indicates a region that is formed at a depth of 1 to 5 μm from the surface of the transparent sealing member facing away from the mounting substrate so as to be between the surface portion and a surface of the transparent sealing member facing the mounting substrate, the surface portion and the interior portion contain aluminum, and an aluminum concentration of the surface portion of the transparent sealing member is higher than an aluminum concentration of the interior portion thereof.

2. The transparent sealing member according to claim 1, wherein assuming that the aluminum concentration of the surface portion is represented by A (ppm), and the aluminum concentration of the interior portion is represented by B (ppm), then $10 \leq A/B \leq 200$.

3. The transparent sealing member according to claim 1, wherein assuming that the aluminum concentration of the surface portion is represented by A (ppm), and the aluminum concentration of the interior portion is represented by B (ppm), then $15 \leq A/B \leq 60$.

4. The transparent sealing member according to claim 1, wherein the aluminum concentration of the surface portion is 500 to 2000 ppm, and the aluminum concentration of the interior portion is 10 to 100 ppm.

* * * * *